(12) United States Patent
Ooishi et al.

(10) Patent No.: US 6,429,495 B2
(45) Date of Patent: *Aug. 6, 2002

(54) SEMICONDUCTOR DEVICE WITH ADDRESS PROGRAMMING CIRCUIT

(75) Inventors: Tsukasa Ooishi; Hiroki Shimano; Shigeki Tomishima, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/208,478

(22) Filed: Dec. 10, 1998

(30) Foreign Application Priority Data

Jun. 17, 1998 (JP) .............................. 10-169439

(51) Int. Cl.[7] .......................... H01L 29/76; H01L 29/94; H01L 31/062; H01L 31/113; H01L 31/119
(52) U.S. Cl. ....................... 257/393; 257/903
(58) Field of Search ................. 257/321, 389, 257/390, 315, 395, 393, 366, 250, 324, 903

(56) References Cited

U.S. PATENT DOCUMENTS

| | | | | |
|---|---|---|---|---|
| 4,132,904 A | * | 1/1979 | Harari | 365/154 |
| 5,291,435 A | * | 3/1994 | Yu | 365/104 |
| 5,317,179 A | * | 5/1994 | Chen et al. | 257/321 |
| 5,631,862 A | | 5/1997 | Cutter et al. | 365/96 |
| 5,652,448 A | * | 7/1997 | Chang et al. | 257/315 |
| 5,703,388 A | * | 7/1997 | Wang et al. | 257/315 |
| 5,741,737 A | * | 4/1998 | Kachelmeier | 438/286 |
| 5,821,581 A | * | 10/1998 | Kaya et al. | 257/321 |
| 5,955,746 A | * | 9/1999 | Kim | 257/69 |

* cited by examiner

*Primary Examiner*—Phat X. Cao
(74) *Attorney, Agent, or Firm*—McDermott, Will & Emery

(57) ABSTRACT

To provide an address programming device free from laser-blowing, a first, thin gate oxide film is formed on a semiconductor substrate, a first gate electrode is formed thereon, a second, thick gate oxide film is formed thereon, and a second gate electrode is formed thereon. Such a device is connected in series to a MOS transistor of the opposite polarity and such arrangements are cross-connected together to form a latch circuit. Data to be programmed and the inverted version thereof are written in the programming device. Programmed information is read depending on the change in weight of the latch when the power supply is turned on.

3 Claims, 17 Drawing Sheets

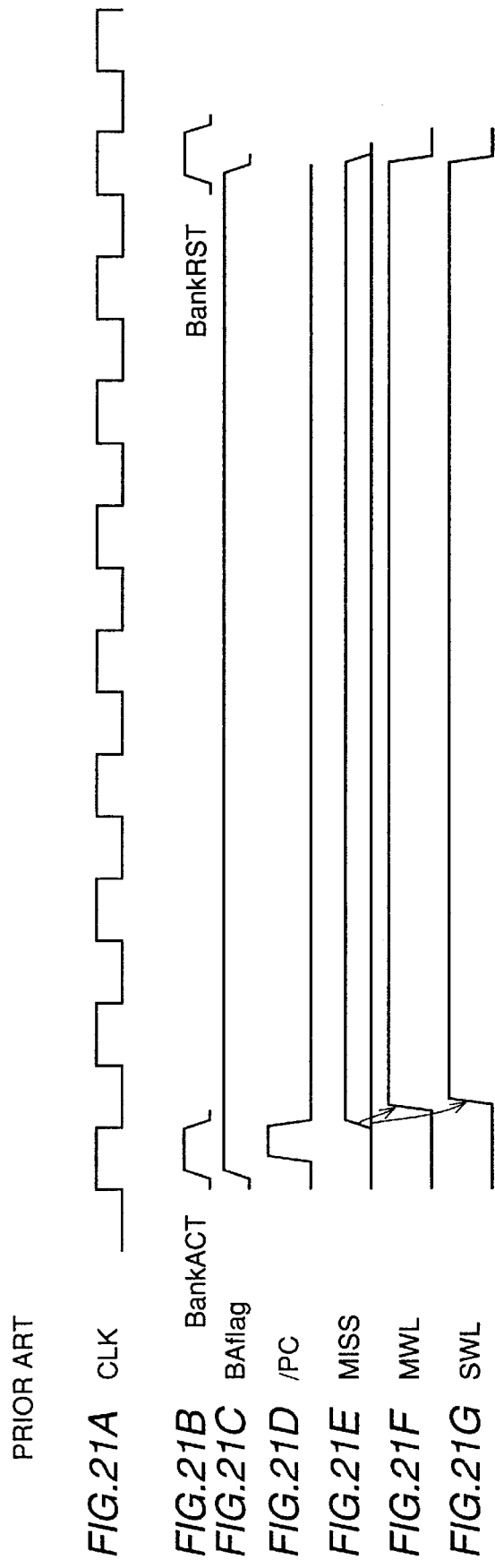

SEMICONDUCTOR DEVICE WITH ADDRESS PROGRAMMING CIRCUIT

BACKGROUND OF THE INVENTION

1. Field of the Invention

The present invention relates to semiconductor devices and more specifically to an address programming device for redundancy decision for semiconductor devices.

2. Description of the Background Art

Conventionally semiconductor memory devices such as SRAM and DRAM are provided with a redundant circuit to improve the yield in manufacturing the semiconductor devices. If a semiconductor memory device manufactured has a defect, the semiconductor memory device is rescued by the function of the redundant circuit. In other words, a row or column of conventional semiconductor memory devices that has a defective memory cell is functionally replaced with a predetermined spare row or column. Thus semiconductor memory devices are provided with a spare memory cell and an address programming circuit for programming a defective address indicative of a location at which a defect is present.

FIG. 20 shows a conventional redundancy decision circuit. In FIG. 20, a precharging circuit 120 precharges a common node 121 which receives a complementary address signal. A series circuit formed of a fuse 110 and an n-channel MOS transistor 100 to a series circuit formed of a fuse 118 and an n-channel MOS transistor 108 are connected in parallel between common node 121 and a ground. The gate of each of n-channel MOS transistors 100 to 108 receives an address signal.

In such a redundancy decision circuit, laser is used to blow any of fuses 110 to 118 to program a defective address. If the fuse is not blown, the corresponding address signal is input, the corresponding n-channel MOS transistor is turned on, a precharged voltage of common node 121 is discharged and the potential of common node 121 decreases. However, if the fuse is blown, the precharged voltage of common node 121 is not discharged, even with the corresponding n-channel MOS transistor turned on.

FIGS. 21A–21G are timing charts for representing an operation of the address programming circuit shown in FIG. 20.

In the clock cycle represented in FIG. 21A, when a bank activating signal represented in FIG. 21B attains a high level in response to a command signal, a bank flag represented in FIG. 21C attains a high level and a precharge signal /PC is temporarily placed in an off state and common node 121 thus attains a high level. When a complementary address matches a programmed address in this state, the potential of a comparison result MISS represented in FIG. 21E does not change and a word line SWL of a spare memory cell represented in FIG. 21G is activated. However, if the input complementary address does not match the programmed address, the potential of comparison result MISS changes and a word line MWL for a normal memory cell represented in FIG. 21F is activated.

However, the programming by blowing such fuses 110 to 118 shown in FIG. 20 requires a laser device for blowing the fuses and thus disadvantageously requires extra investment therefor.

SUMMARY OF THE INVENTION

Therefore a main object of the present invention is to provide a semiconductor device optimal for forming a semiconductor device.

Briefly speaking of the present invention, two types of gate oxide films different in thickness are formed on a semiconductor substrate, a gate electrode is formed on the gate oxide films, and the two types of gate oxide films overlap.

Thus, according to the present invention, a semiconductor device optimal for forming a programming device can be formed.

In a preferred embodiment of the present invention, the two types of gate oxide films different in thickness include a gate oxide film serving as an upper layer and a gate oxide film serving as a lower layer, the gate electrode includes gate electrodes respectively formed on the upper and lower gate oxide films, and the gate structure formed by the upper gate oxide film and gate electrode overlaps with the gate structure formed by the lower gate oxide film and gate electrode.

In a still preferable embodiment of the present invention, the semiconductor device configures a programming device. More preferably, the programming device can be formed by forming the lower gate structure as a transistor of a floating structure the threshold value of which can be changed to provide programming. The programming device is employed as a portion of a latch circuit in which an inverted version of program data is written and programmed.

In an aspect of the present invention, a gate electrode is formed on a gate oxide film to provide an upper gate structure and a gate oxide film is formed at a portion underlying the gate structure.

Still preferably, the semiconductor device forms a programming device which is programmed by destroying the gate oxide film formed at the underlying portion. The programming device is employed as a portion of a latch circuit in which an inverted version of program data is written and programmed.

In another aspect of the present invention, an address programming device is formed by a transistor formed by a first, thick gate oxide film formed on a semiconductor substrate, a second, thin gate oxide film formed on the first, thick gate oxide film and a gate electrode formed on the second, thin gate oxide film, wherein a portion of the first, thick gate oxide film is removed and the second, thin gate oxide film is formed thereon.

Still preferably, electric field is applied between the channel region and gate electrode of the transistor, for the programming. Such transistors are arranged in an array.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a circuit diagram showing an example adapted to prevent an extremely large current from flowing into a latch circuit upon power-on.

FIGS. 21A–21G are time charts for representing an operation of the conventional address programming circuit shown in FIG. 16.

DESCRIPTION OF THE PREFERRED EMBODIMENTS

FIGS. 1A–1E show the structure of an address programming device according to one embodiment of the present invention in cross section and a process for manufacturing the same.

In FIGS. 1A–1E, the address programming device according to one embodiment of the present invention in cross section and a process for manufacturing the same.

Figure 1A:
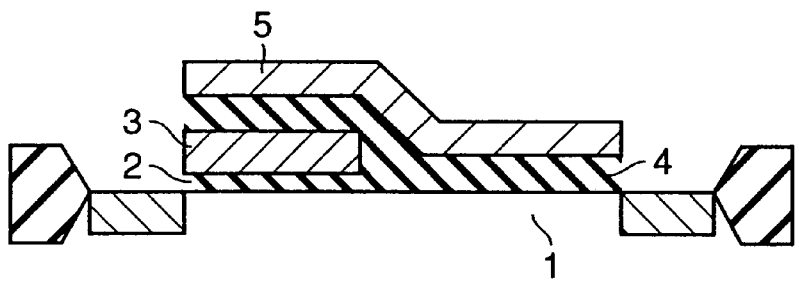
FIGS. 1A–1E show the structure of an address programming device according to one embodiment of the present invention in cross section and a process for manufacturing the same.
Figure 1B:
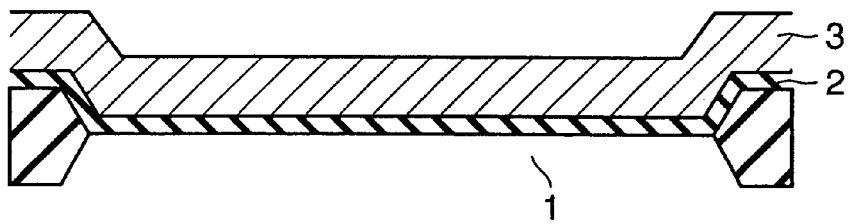

In FIGS. 1A–1E, the address programming device according to one embodiment of the present invention has two types of gate oxide film, i.e. a thin oxide film and a thick oxide film. That is, as shown in FIG. 1B, an active region and an isolation region are formed on a semiconductor substrate 1 and then a thin oxide film (a gate oxide film) 2 is produced and a gate electrode 3 is formed on thin oxide film 2. Gate electrode 3 is formed of e.g. polysilicon, TiSi, WSi, metal.

Figure 1C:
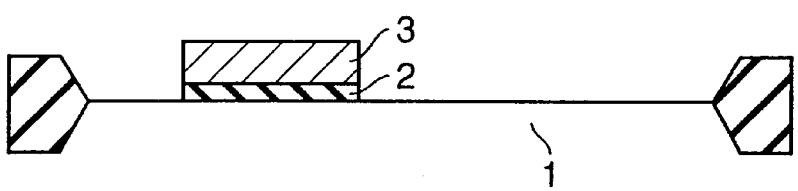
Figure 1D:
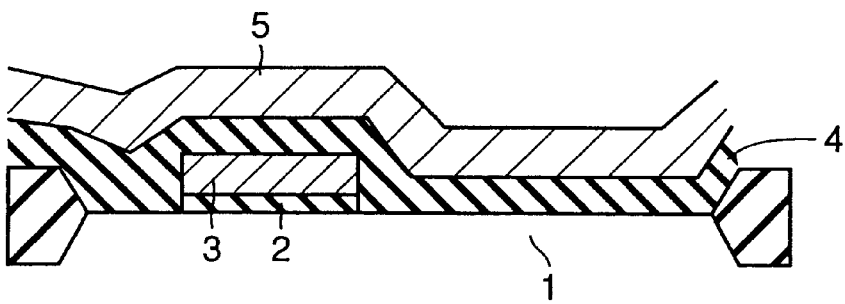
Figure 1E:
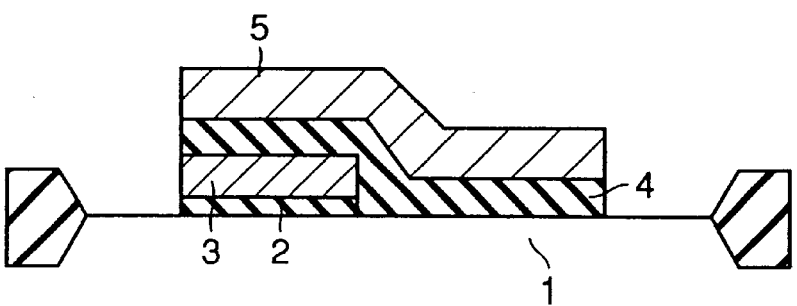

Gate electrode 3 is patterned as shown in FIG. 1C. Then, a thick oxide film 4 covering semiconductor substrate 1 and gate electrode 3 is formed and a gate electrode 5 is then formed on thick oxide film 4, as shown in FIG. 1D. They are patterned as shown in FIG. 1E. Thus a programming device is formed having a dual structure formed of the lower gate electrode 3 and the upper gate electrode 5, as shown in FIG. 1A.

While in the example shown in FIG. 1 the lower and upper gate electrodes 3 and 5 overlap such that the lower gate electrode 3 is covered by a portion of the upper gate electrode 5, the lower gate electrode 3 may be covered with the entirety of the upper gate electrode 5. These structure then go through the subsequent steps required to form a transistor, such as forming a well, a source/drain and the like, although the steps are not shown in the figures.

FIGS. 2A–2F show the structure of an address programming device according to another embodiment of the present invention in cross section and a process for manufacturing the same.

Figure 2A:
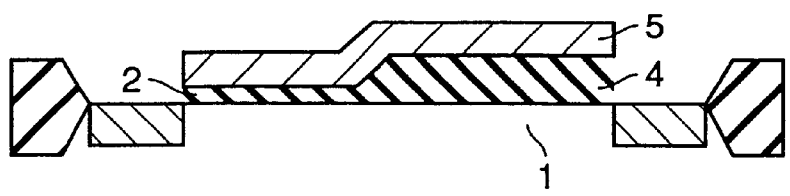
FIGS. 2A–2F show the structure of an address programming device according to another embodiment of the present invention in cross section and a process for manufacturing the same.
Figure 2B:
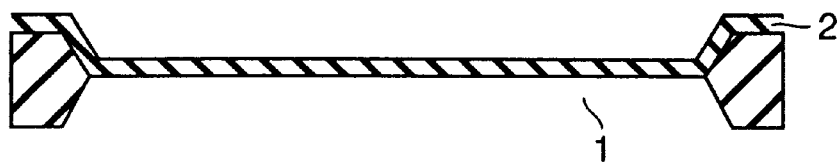
Figure 2C:
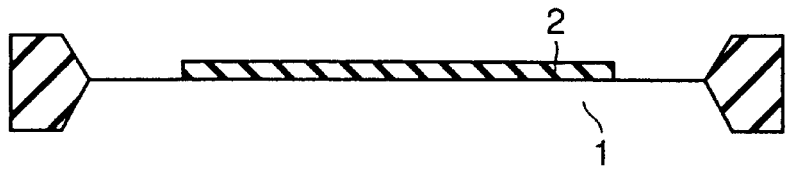
Figure 2D:
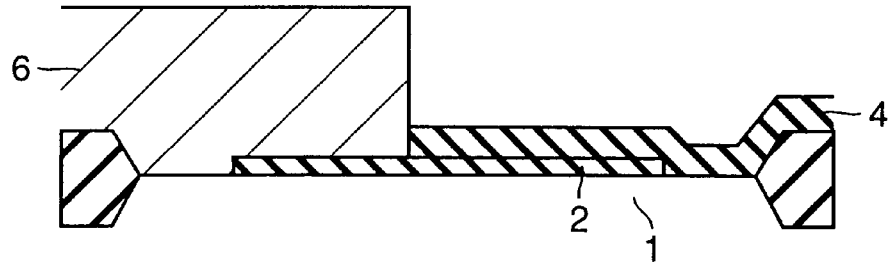
Figure 2E:
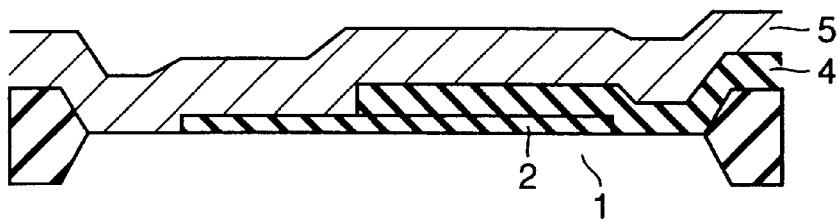
Figure 2F:
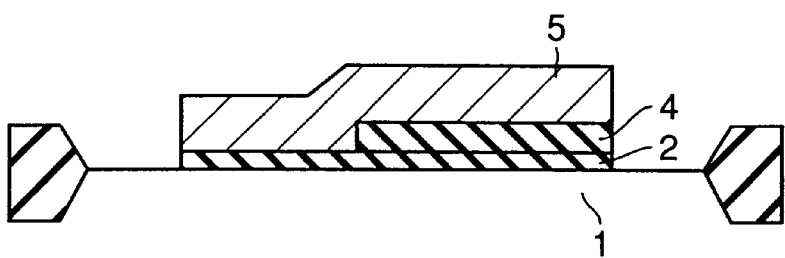

Initially a gate oxide film 2 formed of a thin oxide film is formed on a semiconductor substrate 1, as shown in FIG. 2B. Then gate oxide film 2 is patterned as shown in FIG. 2C. Then, a resist 6 is formed at a portion which must not be covered by the next, thick oxide film, as shown in FIG. 2D. Then, the thick oxide film 4 is formed at a portion excluding resist 6. Then resist 6 is removed and a gate electrode as shown in FIG. 2E is formed thereon. Then it is patterned as shown in FIG. 2F to form a gate structure having a partial thin gate oxide film portion and a partial thick gate oxide film portion, as shown in FIG. 2A.

As is similar to FIGS. 1A–1E, the structure also goes through the subsequent steps required to form a transistor, such as forming a well, a source/drain and the like, although the steps will not be described here.

Figure 3A:
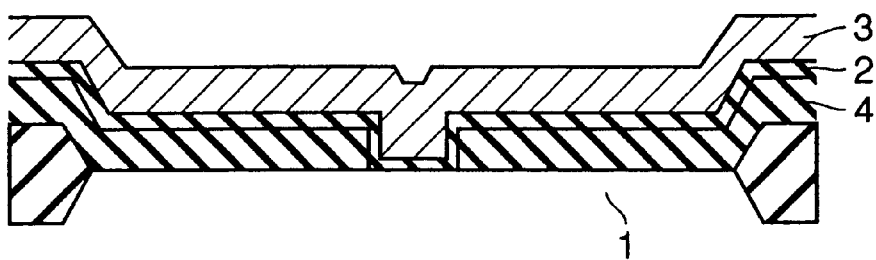
FIGS. 3A–3E show the structure of an address programming device according to still another embodiment of the present invention in cross section and a process for manufacturing the same.
Figure 3B:
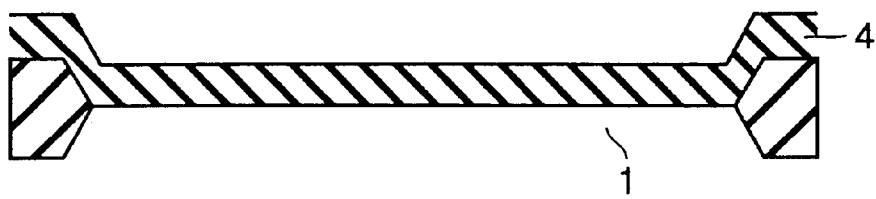
Figure 3C:
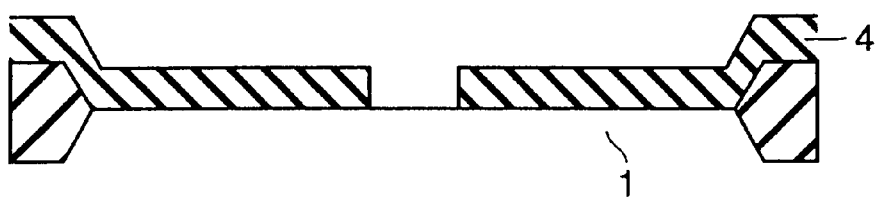
Figure 3D:
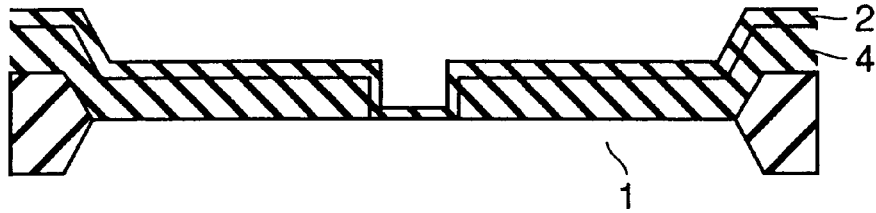
Figure 3E:
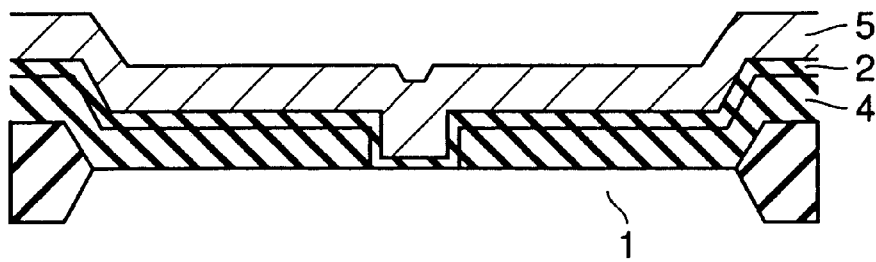

FIGS. 3A–3E show the structure of an address programming device according to still another embodiment of the present invention in cross section and a process for manufacturing the same. According to the present embodiment, a thick oxide film is initially formed and a thin oxide film and an electrode are subsequently formed. More specifically, as shown in FIG. 3B, an active region and an isolation region are initially produced on a semiconductor substrate 1 and a thick oxide film (a gate oxide film) 4 is then formed. Then gate oxide film 3 is patterned as shown in FIG. 3C and a thin oxide film 2 is formed entirely as shown in FIG. 3D. A gate electrode 5 is also formed thereon. They are patterned to form a partial thin gate oxide film portion and a partial thick gate oxide film portion in the gate structure. If the removed region of thick oxide film 4 is small in the process, thin oxide film 2 subsequently formed will have uneven thickness. This unevenness can be thinned at the small region. This structure then goes through the subsequent steps required to form a transistor, such as forming a well, a source/drain and the like, although they will not be described here.

Figure 4:
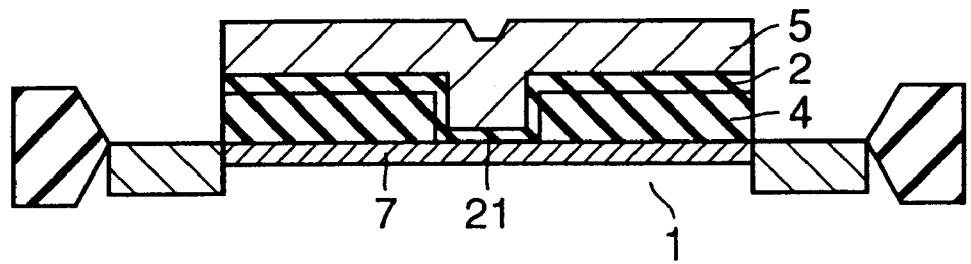
FIG. 4 is a cross section of the FIG. 3 address programming device seen in another direction.

FIG. 4 is a cross section of the FIG. 3 address programming device seen in another direction. With the configuration according to the present invention employed as a programming device, application of electric field destroys a thin oxide film 21 formed between a channel 7 extending from a source/drain region and a gate electrode 5.

Figure 5:
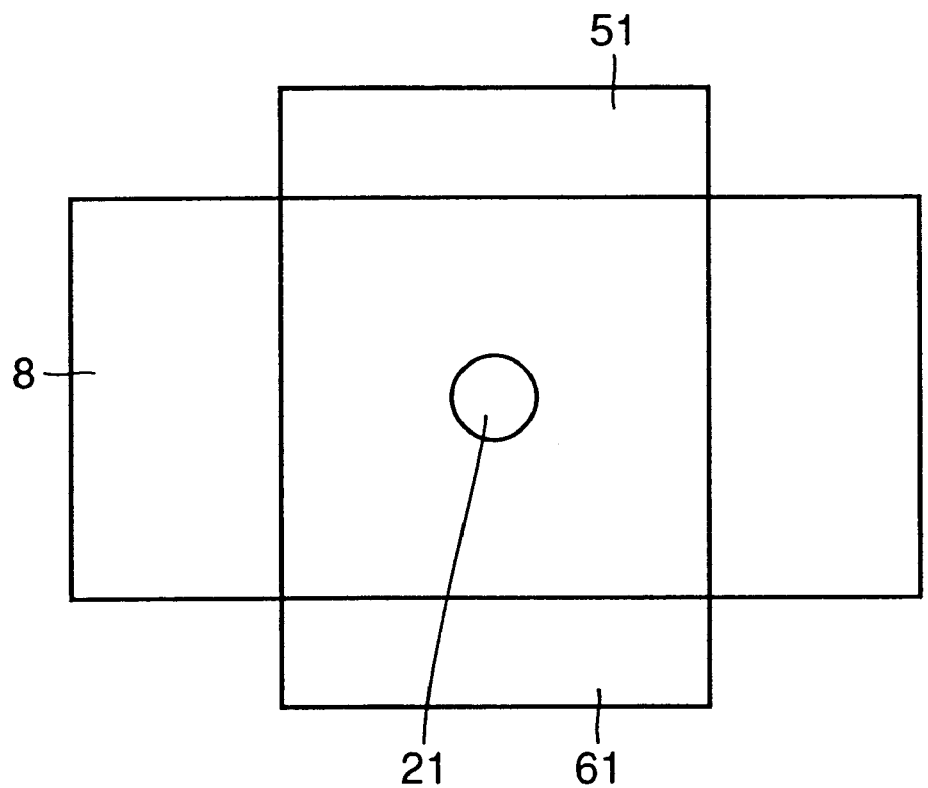
FIG. 5 is a top view of the FIG. 4 programming device according to the present invention.

FIG. 5 is a top view of the programming device shown in FIG. 4. As shown in FIG. 4, thick oxide film 4 surrounds thin oxide film 21. When positive voltage is applied to a gate electrode 51, a lead of the destroyed portion is detected as a gate leakage current at an active region 8 via the channel of thick oxide film 3 turned on.

Figure 6:
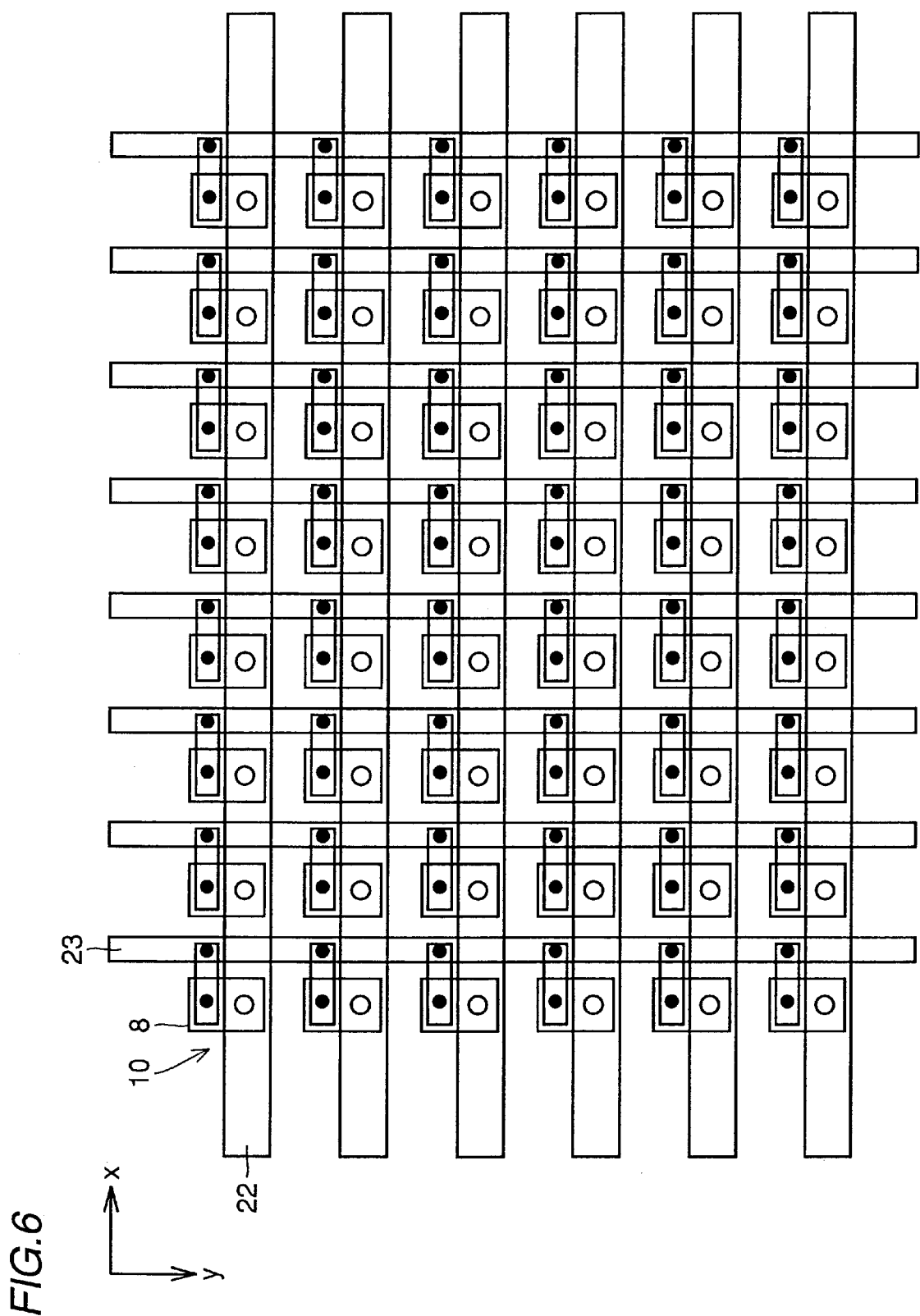
FIG. 6 is a top view showing the FIG. 5 programming devices arranged in an array.

FIG. 6 is a top view of the FIG. 5 programming devices arranged in an array.

In FIG. 6, a large number of address programming devices 10 are arranged in x and y directions. It should be noted that while address programming device 10 shown in FIG. 5 has active region 8 formed on both sides thereof, that shown in FIG. 6 has active region 8 formed only on one side thereof. Each active region 8 is connected to an interconnection 23 extending in the y direction and each channel region is connected to a gate interconnection 22 extending in the x direction.

In programming these programming devices 10, voltage is applied between each gate, interconnection 23 connecting each active region 8 together, and interconnection 22 to apply electric field to destroy thin oxide film 23. For example, if address programming device 10 is formed of n-channel MOS, positive voltage is applied to gate interconnection 22 of the device to form a channel and negative voltage is applied to interconnection 23 of the device to increase electric field.

Another programming device whose respective gate interconnection 22 receives positive voltage has the applied electric field reduced by grounding its respective interconnection 23. Thus it is not programmed. Another device whose respective interconnection 23 receives negative voltage has the applied electric field reduced by grounding its respective interconnection 22. Thus it is not programmed.

If address programming device 10 is of p-channel MOS, the voltages opposite to those referred to above need only be applied.

Figure 7:
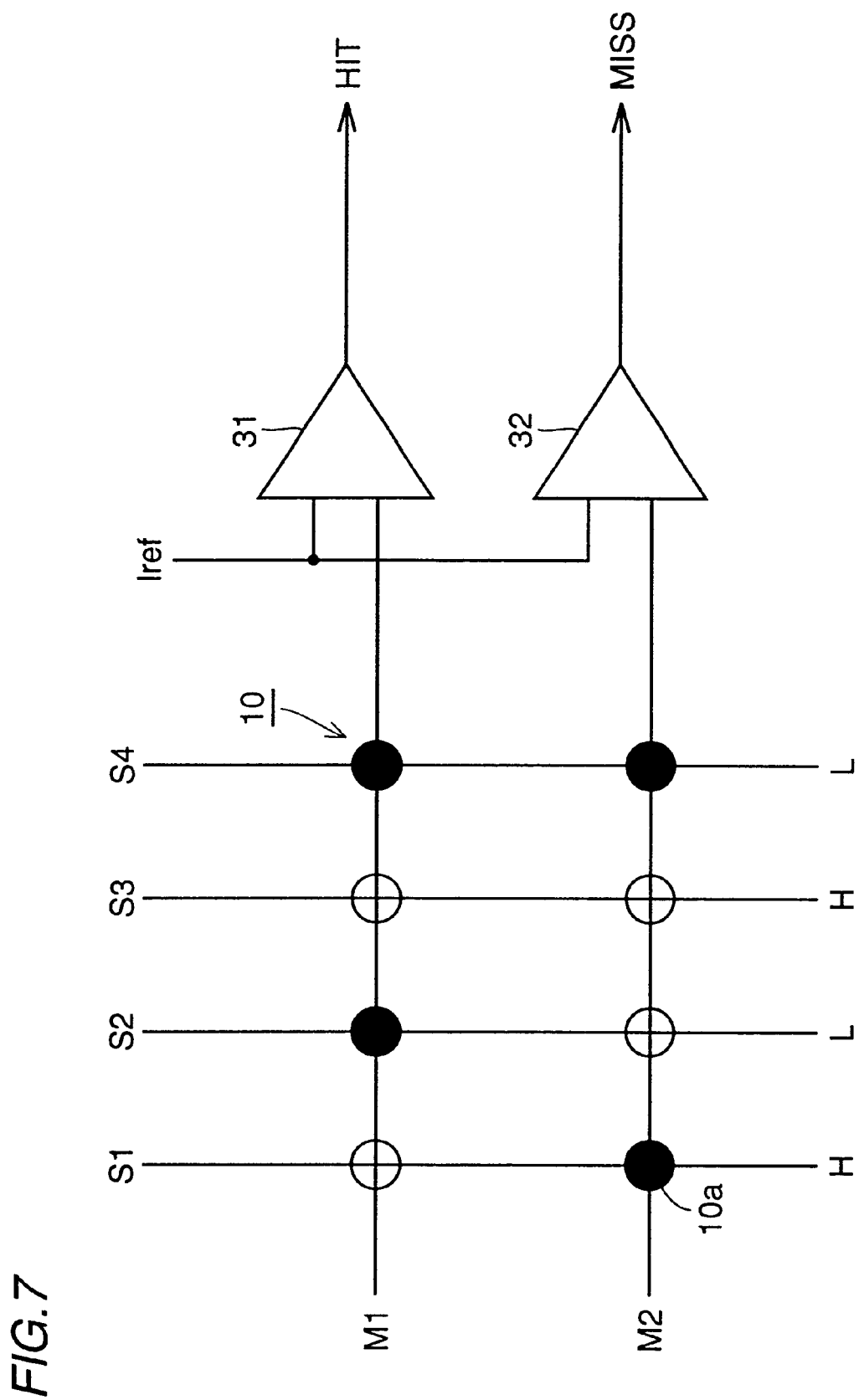
FIG. 7 is a view for illustrating a method of reading a device programmed as shown in FIG. 6.

FIG. 7 is a view for illustrating a method of reading a device programmed as shown in FIG. 6.

In FIG. 7, address programming device 10 according to the present invention is connected to each of the intersections of lines S1 to S4 and lines M1 and M2. In FIG. 7, ● represents a device with its oxide film destroyed and ○ represents a device with its oxide film undestroyed. Comparators 31 and 32 are connected to lines M1 and M2, respectively, to compare the signals supplied from lines M1 and M2 with a reference potential.

When the input signals input on lines S1 to S4 are as follows: S1=high level, S2=low level, S3=high level and S4=low level, any current leakage from lines S and the associated elements is not caused on line M1, since the devices that receive the high-level signals are undestroyed on line M1. On line M2, however, current leakage is caused via a device 10a. The potential of line M1 without current leakage and that of line M2 with current leakage are compared with the reference potential in comparators 31 and 32. Comparator 31 provides a decision "HIT" and comparator 32 provides a decision "MISS".

Figure 8A:
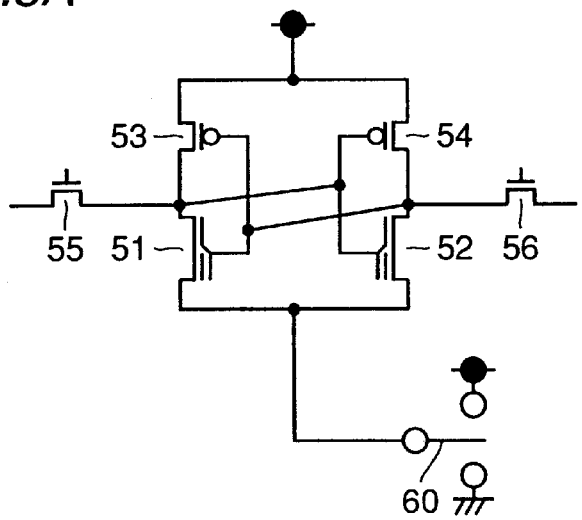
FIGS. 8A–8C is an electrical circuit diagram of a latch circuit employing the programming device shown in FIG. 1.
Figure 8B:
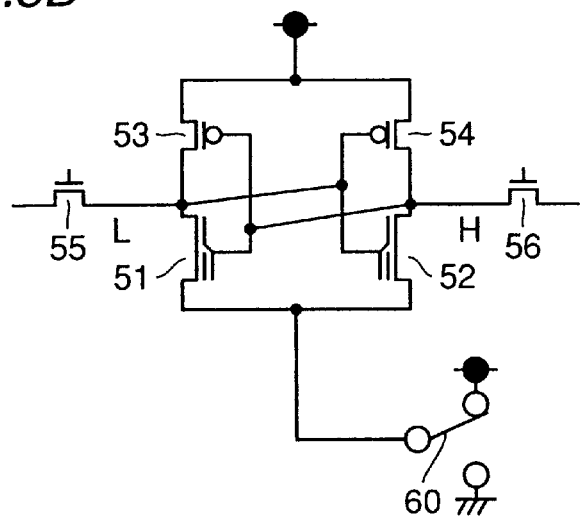
Figure 8C:
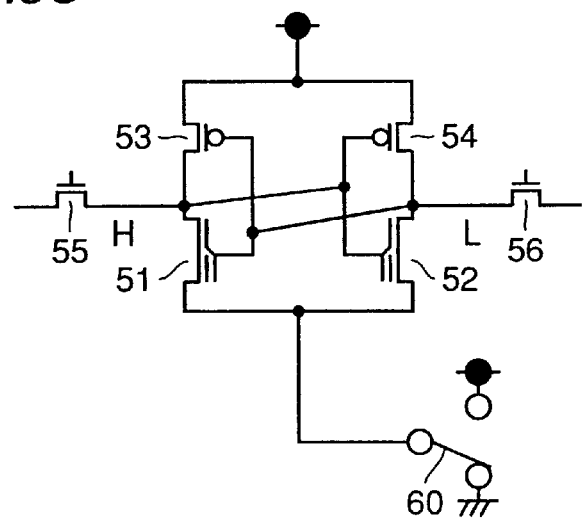

FIGS. 8A–8C are electrical circuit diagrams showing a latch circuit employing the device shown in FIG. 1. As shown in FIG. 8A, devices 51 and 52 having thin oxide film that are formed of n-channel MOS, and p-channel MOS transistors 53 and 54 are connected in a cross-coupled manner. Access transistors 55 and 56 for selection of reading/writing are connected to their respective cross-couple connection points. P-channel MOS transistors 53 and 54 receive a power supply voltage at their respective sources. On the source side of programming devices 51 and 52 is connected a switch 60 for switching between a power supply potential and a ground potential.

To program devices 51 and 52, an inverted version of the data desired to be programmed is written in the latch circuit via access transistors 55 and 56. For example, a low-level signal is applied to the latch circuit via access transistor 55 and a high-level signal is applied to the latch circuit via access transistor 56, as shown in FIG. 8B.

Then switch 60 is switched to the power supply potential and the high-level signal is applied to the gate of device 51. Consequently a current flows into device 51 and electrons flow into the floating gate of device 51 via the thin oxide film thereof and are thus accumulated. Thus the apparent threshold value of device 51 is increased and the driving capability of device 51 deteriorates.

In reading, switch 60 is switched to the ground potential, as shown in FIG. 8C. As the power supply is changed gradually from the ground potential, the force to lower the device 51 drain to a low level is reduced or the device 51 drain is hardly lowered to the low level, since the program device 51 has the high threshold value. By contrast, the device 52 gate is maintained at a threshold voltage unchanged and the drain is lowered to a low level. Then the latch circuit is self-amplified and thus the device 51 drain is maintained at the high level and the device 52 drain is maintained at the low level and data is thus output.

Figure 9:
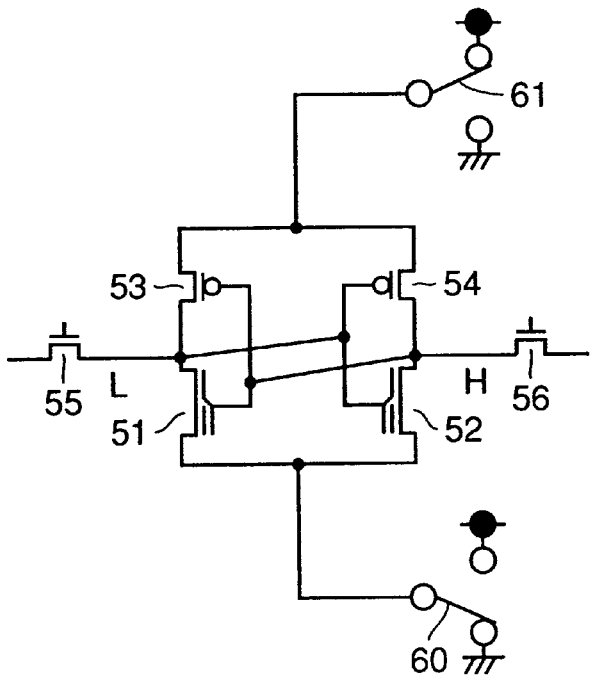
FIG. 9 is a circuit diagram showing an improvement of the latch circuit shown in FIG. 8.

FIG. 9 is a circuit diagram showing an improvement of the latch circuit shown in FIGS. 8A–8C.

In the example shown in the figure, one of devices 51 and 52 is held at a high level and the other at a low level in power-on. However, as the power supply potential decreases, they are used with their threshold values lowered. This means that a through current flowing through a device turned off is increased. To avoid this condition, the power supply is placed in an on state for example only in reading a programming device in a low cycle of a DRAM. Normally, switches 60 and 61 are both switched to the ground potential. In reading information from the latch circuit, however, switch 61 is switched to the power supply potential, as shown in FIG. 8C. Through current can thus be reduced.

Figure 10:
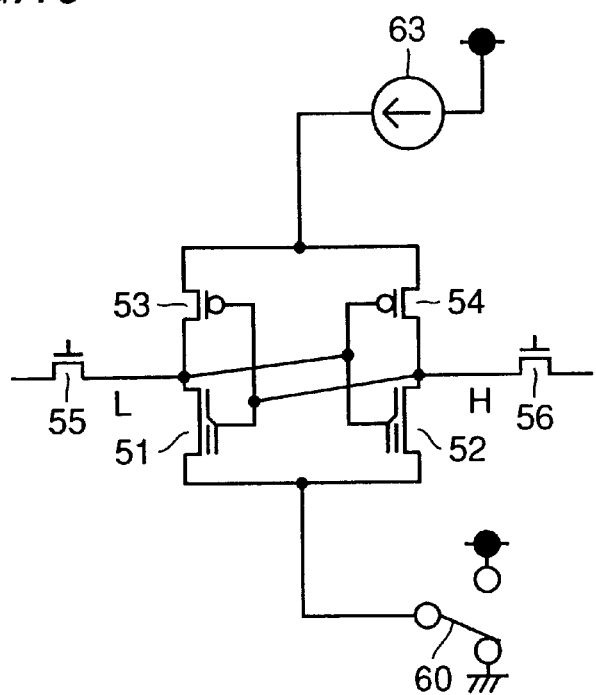

FIG. 10 is a circuit diagram showing an example adapted to prevent extremely large current from flowing into the latch circuit at power-on. For the examples shown in FIGS. 8A–8C and 9, when extremely large current flows into the latch circuit upon power-on, noise is added and the latch circuit receives the noise so that a low level might not be read as a high level and a high level might not be read as a low level. Accordingly, instead of supplying a current to the latch circuit immediately at power-on, a constant current supply 63 provides a phase difference in activating the current, to supply the power supply voltage to the latch circuit. Thus, erroneous reading can be avoided and rush current can be reduced in turning on the power supply.

FIGS. 11A–11D is a circuit diagram showing an example employing the FIG. 2 device to form the latch circuit.

Figure 11A:
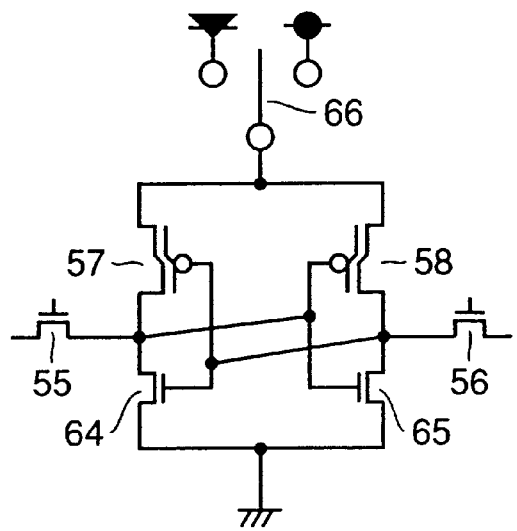
FIGS. 11A–11D are circuit diagrams showing examples employing the FIG. 2 device to form a latch circuit.

In FIG. 11A, programming devices 57 and 58 formed of p-channel MOS are cross-coupled with n-channel MOS transistors 64 and 65, and access transistors 56 and 57 for reading/writing selection are connected to nodes of the cross coupling. The sources of devices 57 and 58 are connected to a switch 66 for switching the power supply between the power supply potential and a high potential level, such as a voltage the level of which is higher than the power supply potential and larger than the breakdown voltage of the thin gate oxide film.

Figure 11B:
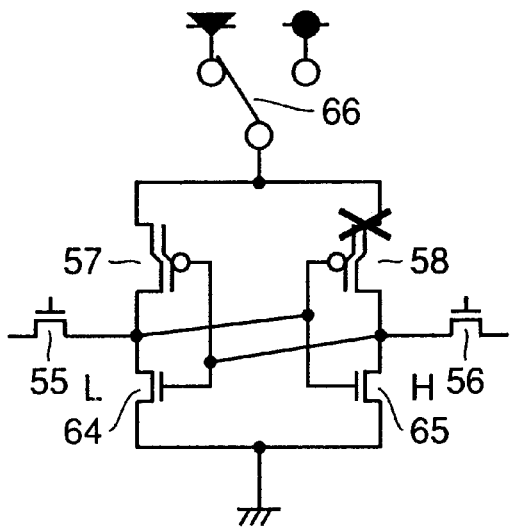
Figure 11C:
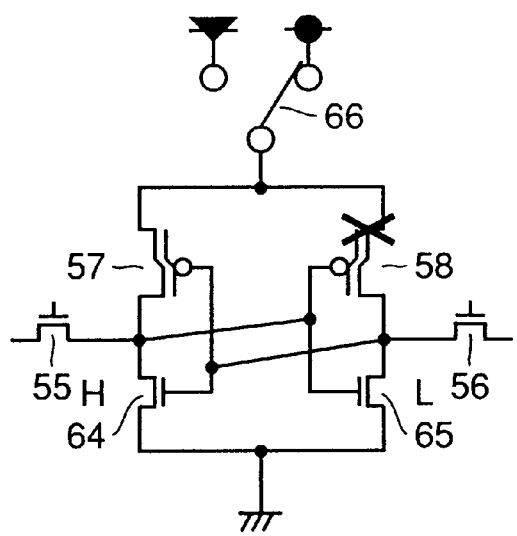

In the present embodiment also, as is similar to FIG. 8, the inverted version of programmed data is written in the latch circuit via access transistor 55, 56, as shown in FIG. 11B. Then, switch 66 is switched to the potential higher than the power supply potential level and a voltage larger in level than the breakdown voltage of the thin gate oxide film is applied to devices 57 and 58. The application of this voltage destroys the thin oxide film of device 57 to which a low level is applied. Thus, the programming is effected, and switch 66 is switched to the power supply potential in reading, as shown in FIG. 11C. When the power supply voltage is applied to the latch circuit, program information is detected, since the thin oxide film of device 58 of the latch circuit has been destroyed and the weight of the latch has thus been changed. More specifically, a leakage current flows in from the power supply via device 58 with the thin oxide film destroyed and a common node of the undestroyed device 57 is charged, whereas a common node of the destroyed device 58 has the gate voltage of the p-channel MOS portion of the thick oxide film fixed to a high level so that the leakage current from the power supply does not flow into device 58 and n-channel MOS transistor 65 is turned on to discharge. Thus the directivity of the latch is determined.

Figure 11D:
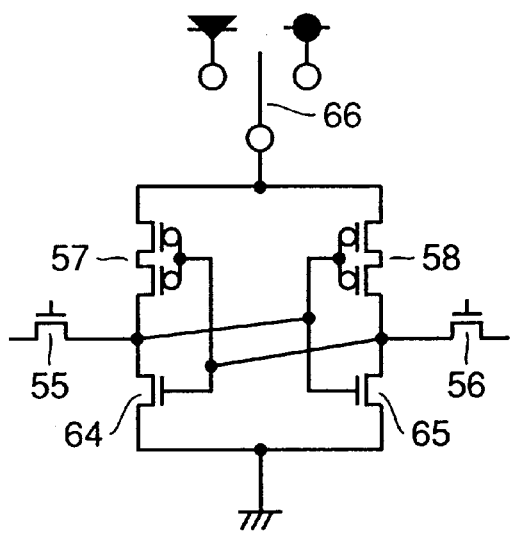

FIG. 11D shows a circuit equivalent to that shown in FIG. 11A.

Figure 12:
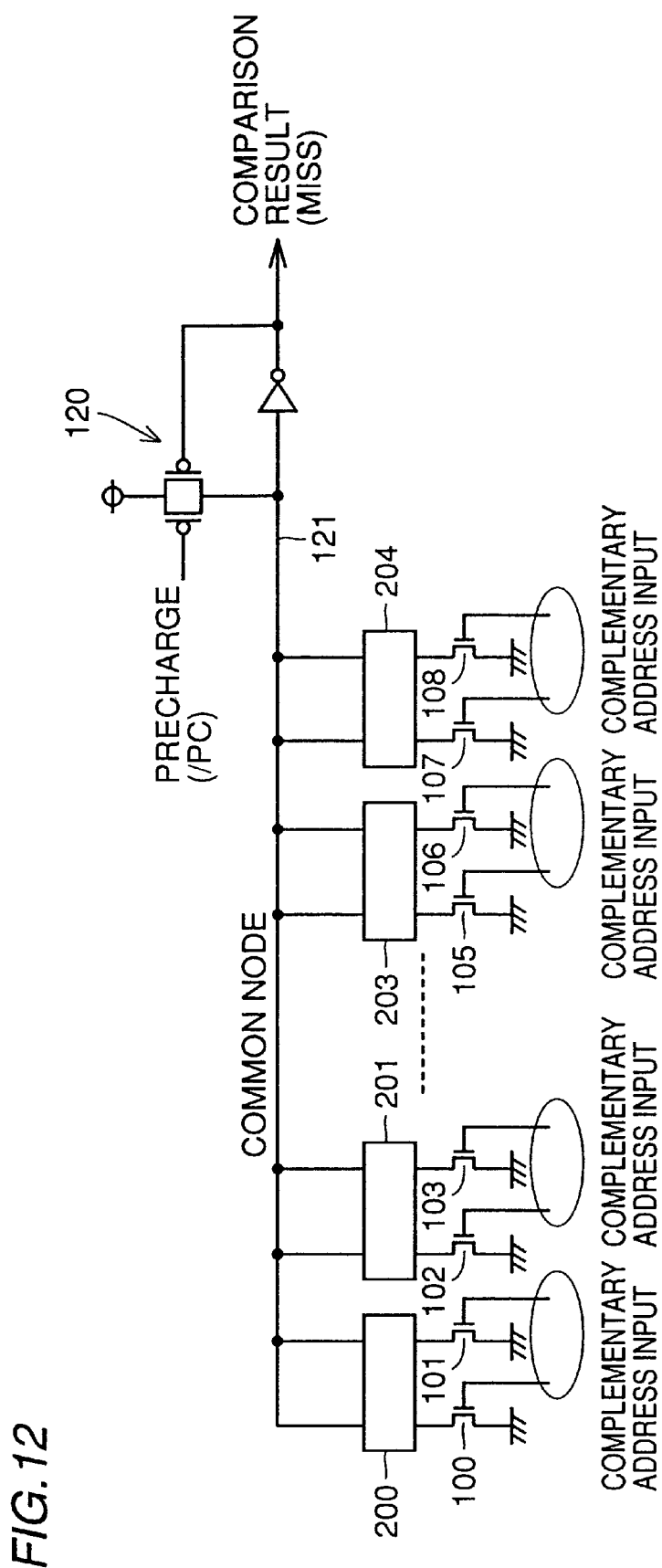
FIG. 12 shows a redundancy decision circuit employing the address programming device according to one embodiment of the present invention.
Figure 16:
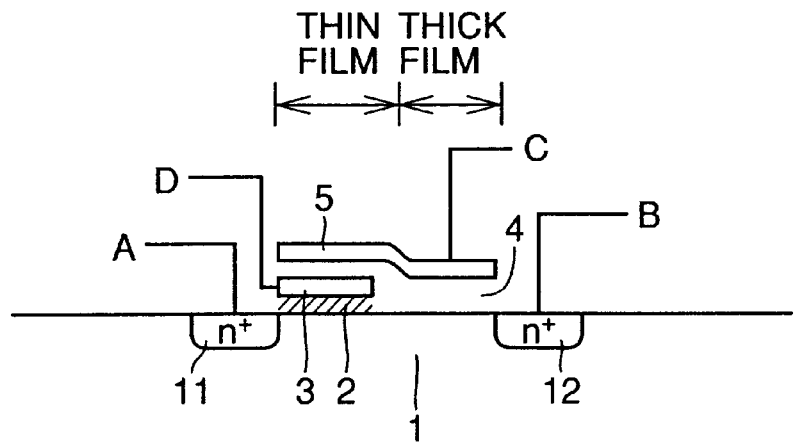
FIG. 16 is a cross section of a structure of an address programming device according to still another embodiment of the present invention.

FIG. 12 is a diagram showing a redundancy decision circuit employing the address programming device according to one embodiment of the present invention, as compared with the conventional example shown in FIG. 16. In FIG. 12, a common node 121 precharged by a precharge circuit 120 connects with address programming circuits 200, 201, . . . , 203, 204 and n-channel MOS transistors 100 to 108 are respectively connected between address programming circuits 200, 201, . . . , 203, 204 and ground.

Figure 13:
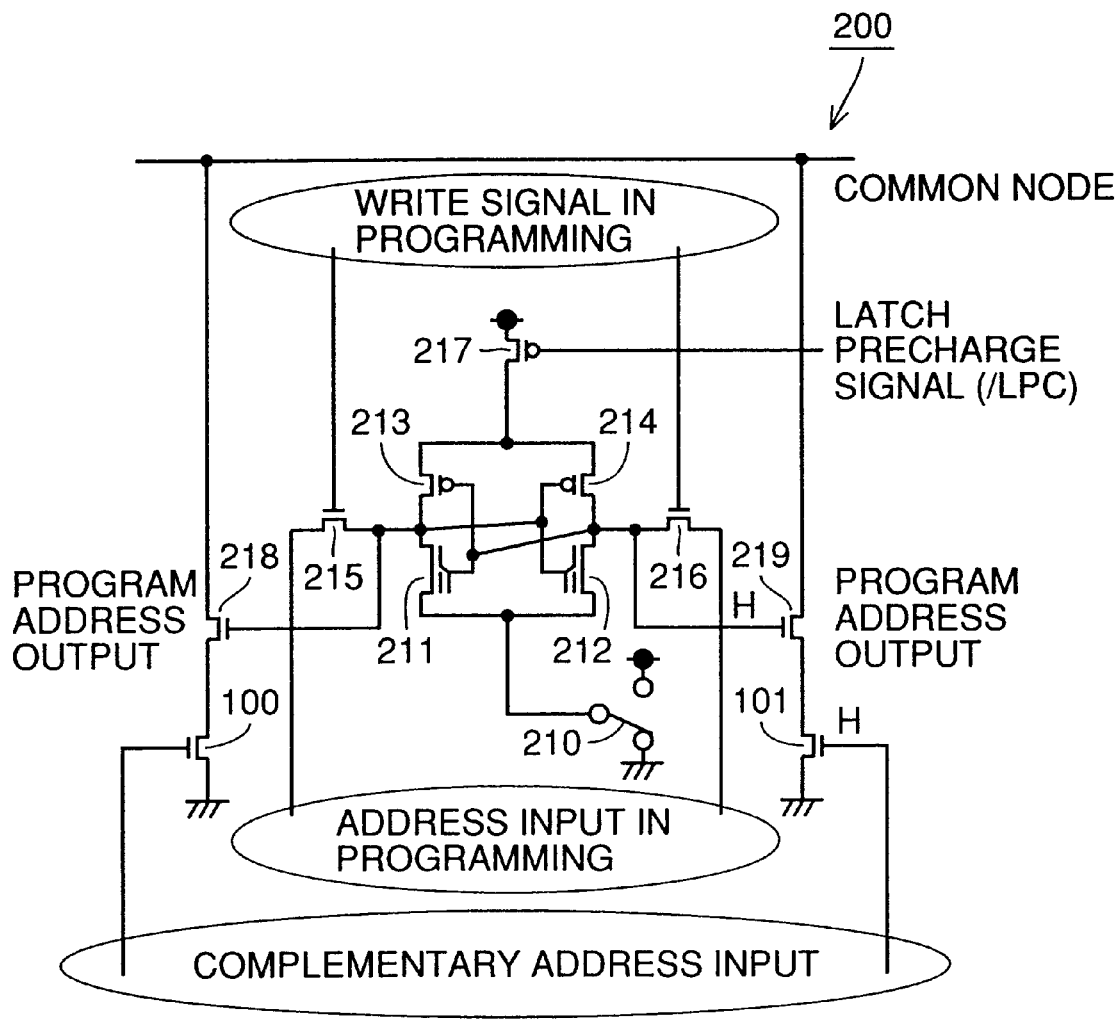
FIG. 13 is a specific circuit diagram of the address programming circuit shown in FIG. 12.
Figure 14:
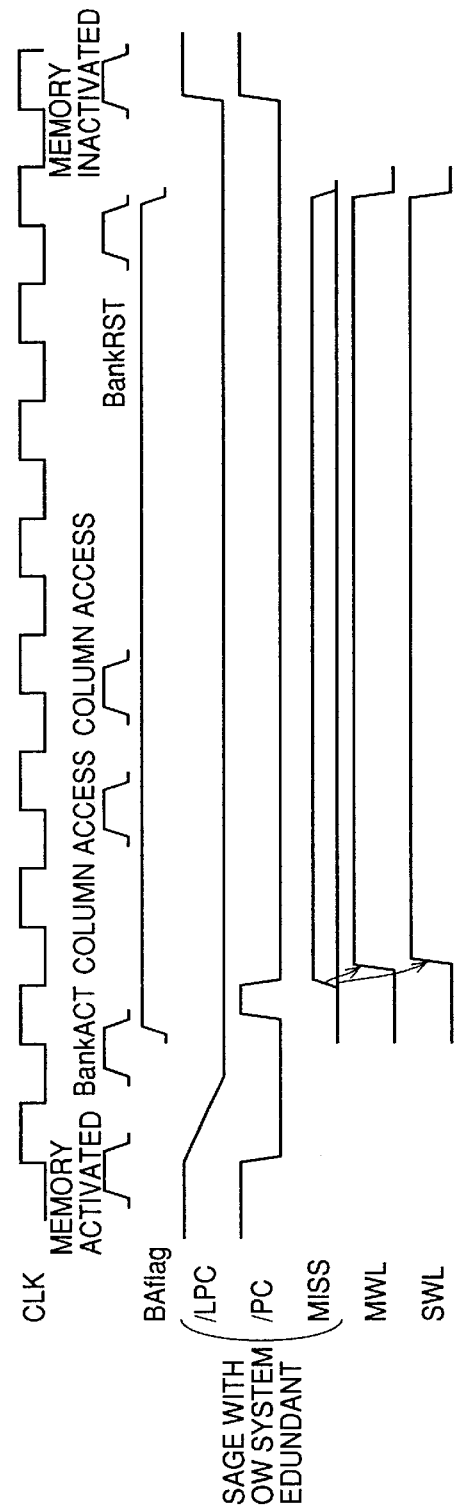
FIGS. 14A–14H are time charts representing an operation when the FIGS. 12 and 13 redundancy decision circuit is associated with columns in use.

FIG. 13 is a specific circuit diagram showing an address programming circuit shown in FIG. 12. In FIG. 13, address programming circuit 200 is configured using the device shown in FIG. 1. More specifically, devices 211 and 212 having thin oxide film and each constituted by an n-channel MOS transistor and p-channel MOS transistors 213 and 214 are connected together in a cross-coupled manner to form a latch circuit. Between the sources of p-channel MOS transistors 213 and 214 and the power supply are connected an n-channel MOS transistor 217 receiving a latch precharge signal /LPC at its gate. A switch 210 is also connected between the sources of devices 211 and 212 and the ground.

Cross-couple connection points of the latch circuit connect with the sources of n-channel MOS transistors 215 and 216 for writing/reading access, each having a drain receiving an address signal in programming. The gates of n-channel MOS transistors 215 and 216 receive a write signal in programming. Between common node and ground are connected a series circuit configured of n-channel MOS transistors 218 and 100 and a series circuit configured of n-channel MOS transistors 219 and 101. The gates of n-channel MOS transistors 218 and 219 are connected to the cross-coupling points of the latch circuit. The gates of n-channel MOS transistors 100 and 101 receive a complementary address signal.

FIGS. 14A–14H and 15A–15E are time charts for representing an operation of the circuit shown in FIGS. 12 and 13. In particular, FIGS. 14A–14H represents an operation when the column system is used as redundant, and FIGS. 15A–15E represents an operation when the row system is used as redundant.

In FIG. 13, in programming, the gates of n-channel MOS transistors 125 and 126 receive a high-level write signal. Transistors 215 and 216 are turned on and their respective drains receive an address signal in programming. Switch 215 is switched to the power supply, and as has been described with reference to FIG. 8B an apparent threshold value of either one of devices 211 and 212 is increased depending on the programmed data to be programmed so that its driving capability is lowered.

Figure 17:
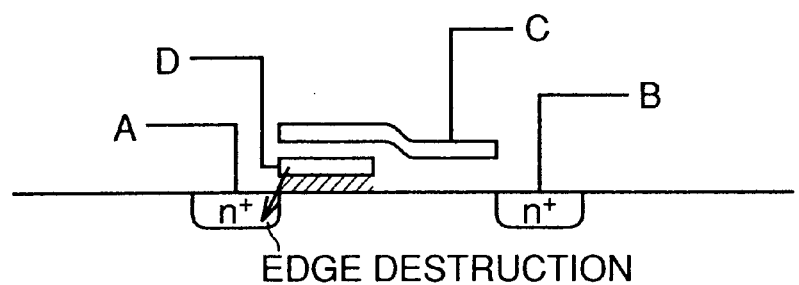
FIG. 17 is a view for illustrating a procedure of destroying and programming the FIG. 16 address programming device.

In reading, as is similar to the conventional example represented in FIG. 17, according to the clock cycle represented in FIG. 14A a memory is activated and a bank activating signal rises in response to a command signal, and as shown in FIG. 14B, a bank flag attains a high level.

Simultaneously with the activation of the memory, a latch precharge signal /LPC represented in FIG. 14D falls to a low level, p-channel MOS transistor 217 shown in FIG. 13 turns on and the latch circuit is precharged. When switch 210 is switched to the ground, programmed data is read from the latch circuit and supplied to the gates of n-channel MOS transistors 218 and 219, as has been described with reference to FIG. 8C.

The gates of n-channel MOS transistors 100 and 102 have received a complementary address signal. If the programmed data does not match the complementary address, the common node attains the ground potential. If the programmed data matches the complementary address, the potential of the common node does not change. Thus, if the programmed data matches a complementary address, the potential of comparison result MISS does not change, as represented in FIG. 14F, so that word line SWL for a spare memory cell represented in FIG. 14H is activated. If the programmed data does not match a complementary address, the potential of comparison result MISS varies to activate word line MWL for a normal memory cell represented in FIG. 14G.

Figure 15:
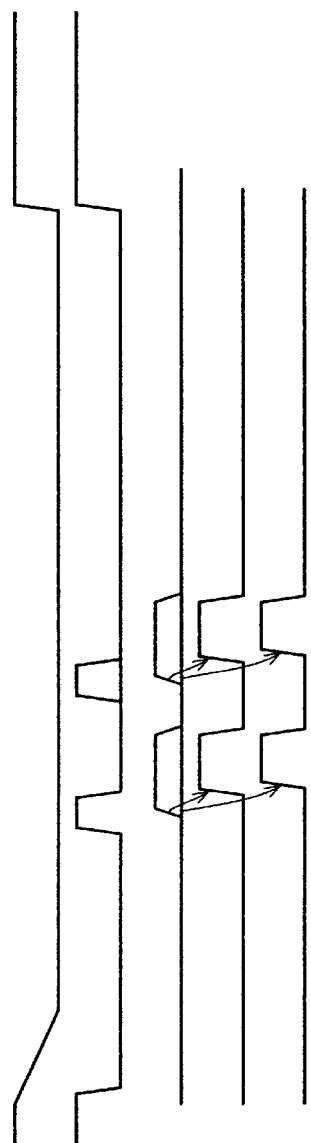
FIGS. 15A–15E are time charts representing an operation when the FIGS. 12 and 13 redundancy decision circuit is associated with rows in use.

For use with the row system as being redundant, the bank activation signal initially rises and a latch precharge signal /LPC then falls to a low level, and when the bank is reset the common node rises to a high level, as represented in FIG. 15A. The operation with respect to match/mismatch between the programmed address data and a complementary address is identical to that represented in FIG. 14. If they match, an SYS line for a spare memory cell is activated. If they do not match, an NYS line for a normal memory cell is activated.

FIG. 16 shows a cross section of a structure of an address programming device according to still another embodiment of the present invention. The address programming device shown in FIG. 16 is configured as the FIG. 1A address programming device with four terminals. In FIG. 16, a node (or a terminal) A is connected to an n$^+$ layer 11, a node B to an n$^+$ layer 12, a node C to gate electrode 5, and a node D to gate electrode 3.

FIG. 17 illustrates a procedure for destroying and programming the FIG. 16 address programming device. When high voltage is applied from node D and a decoded address signal is supplied to node A, n$^+$ layer 11 is lowered to a ground potential. The potential difference between nodes A and D destroys an edge of thin, gate oxide film 2 under gate electrode 3. Since gate oxide film 2 is thin, it is readily destroyed at low levels which typical oxide film sufficiently withstands.

Whether a gate has been normally destroyed as described above is detected as described below. Initially, the floating gate is charged via node D to attain a high level and n$^+$ layer 12 is also charged via node B to attain a high level. In response to a decoded address signal, node A attains a ground level. Also node C allows the second layer of the gate electrode to attain a high level.

If gate oxide film 2 has not been destroyed, the floating gate is maintained at the high level. Thus the thin-film transistor and thick-film transistor between nodes A and B both turn on and the potential of node B is pulled to a ground potential and attains a low level.

If the gate has been destroyed, the potential of the floating gate is decreased to the ground potential and the thin-film transistor is turned off between nodes A and D. Thus, node B is not pulled to the ground potential and is thus maintained at the high level. Gate destruction can thus be readily detected depending on whether node B is at a low level or a high level.

Figure 18:
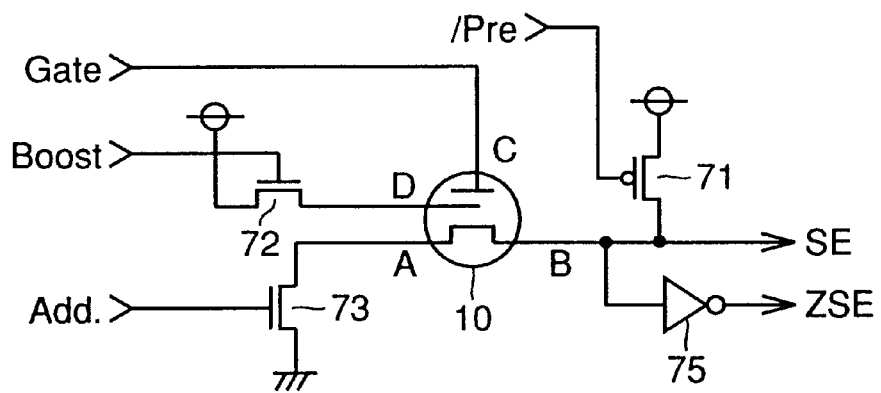
FIG. 18 shows a circuit for providing a programming and detection operation of the FIG. 16 address programming device.

FIG. 18 shows a circuit for providing a programming and detection operation of the FIG. 16 address programming device. In FIG. 18, node C receives a signal Gate, and the gate and source of a p-channel transistor 71 receive a signal /Pre and a power supply voltage, respectively. The p-channel transistor 71 drain is connected to node B of address programming device 10. A spare activation signal SE is output from node B and also inverted by an inverter 75 to output a signal ZSE. The gate of an n-channel transistor 72 receives a signal Boost, the drain thereof receives the power supply potential, and the source thereof is connected to node D. The gate of an n-channel transistor 73 receives a signal Add and the drain thereof is connected to node A of address programming device 10.

An operation of the FIG. 18 circuit will now be described. Signal /Pre is set to a low level and thus placed in a standby state. Once signal Gate rises to attain a high level, node A is charged to a high level. Then, when signal Boost rises to a high voltage level, such as an external power supply level of 3.3V, n-channel transistor 72 is turned on and the floating gate of node D is charged to extVcc-Vth.

When signal Add decoded attains a high level, the potential of node A is lowered to a ground potential. Since the potential of node D is Vcc-Vth, an edge of the thin, gate oxide film is destroyed. When the destruction decreases the level of node D, the current flowing through n-channel transistor 72 is increased to ensure that the edge of the gate is destroyed.

It should be noted that when signal Add does not attain a high level the potential of node A is not decreased to the ground potential. Thus, large potential difference is not obtained and the edge is not destroyed.

The detection operation will now be described. With signal Gate maintained at a low level, signal Boost is once set to attain a high level to turn on N-channel transistor 72 to charge the node D floating gate to attain a high level. Signal /Pre is returned to a high level and p-channel transistor 71 is turned off to float node B. Signal Gate is set to a high level and node C as the second layer of the gate electrode is forced to attain a high level. Signal Add decoded allows n-channel transistor 73 to be turned on and node A attains a ground level.

If in this condition the gate has not been destroyed, the floating gate is maintained at the high level. Thus the both transistors are turned on between nodes A and B and spare activating signal SE is pulled to the ground level. If the gate has been destroyed, the potential of the floating gate is lowered to the ground potential and the thin-film transistor is thus turned off between nodes A and B. Thus, spare activation signal SE is not pulled to the ground potential and is thus maintained at the high level.

Figure 19:
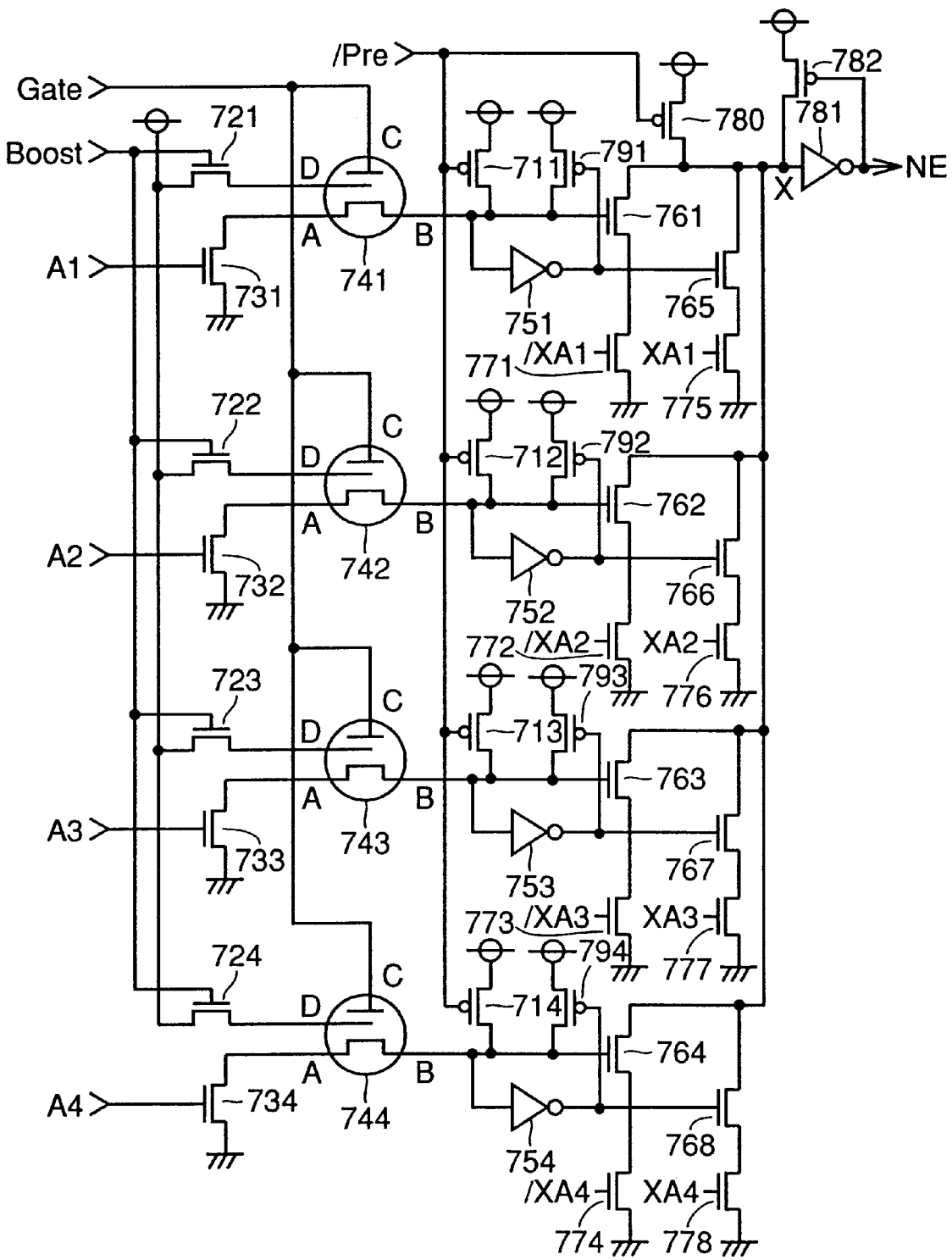
FIG. 19 is a general circuit diagram showing the FIG. 18 circuits of four provided schematically.
Figure 20:
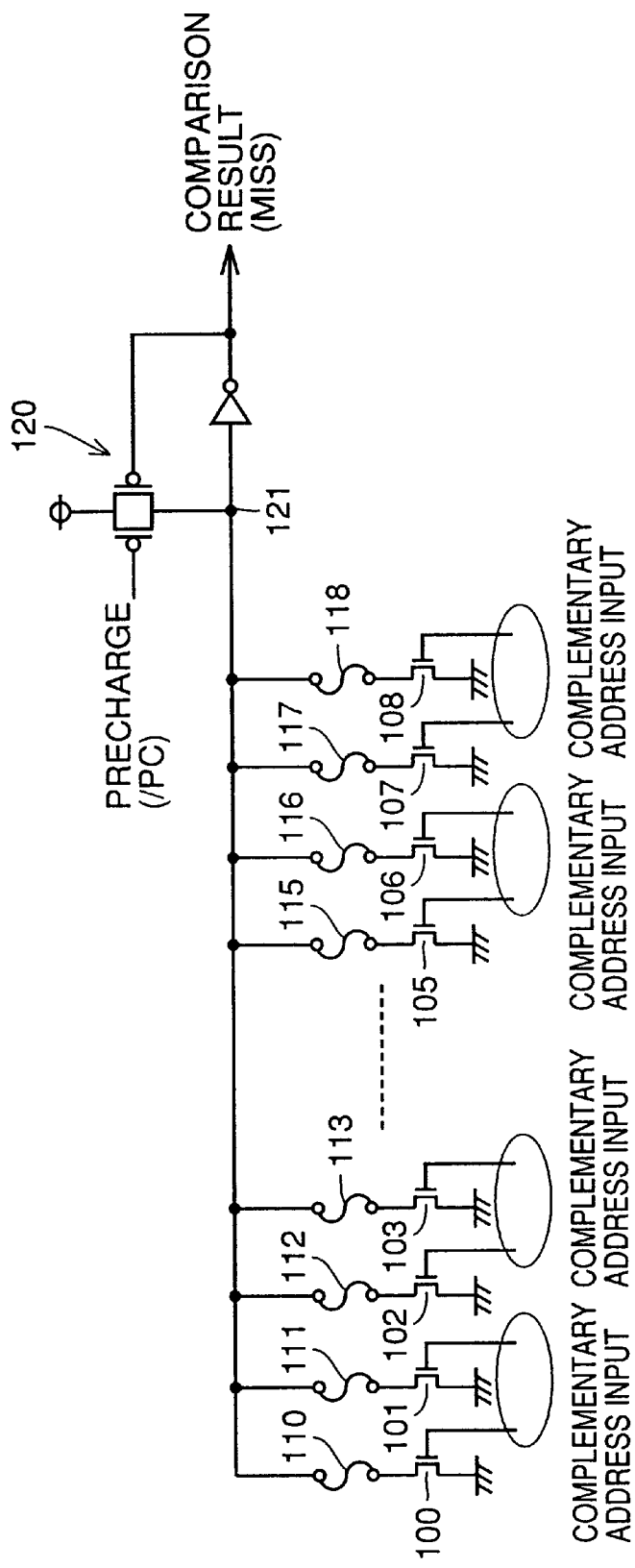
FIG. 20 is a circuit diagram showing a conventional address programming circuit.

FIG. 19 is a general circuit diagram showing the FIG. 18 circuits of four provided systematically. In FIG. 19, address programming devices 741–744, p-channel transistors 711–714, n-channel transistors 721–724 and 731–734 and inverters 751–754 correspond to the FIG. 18 address programming device 10, p-channel transistor 71, n-channel transistors 72 and 73, and inverter 75, respectively. Address programming devices 741–744 each output a spare activation signal NE at their respective nodes B. Signal NE is supplied to the gate of each of n-channel transistors 761–764. The outputs from inverters 751–754 are supplied to the respective gates of n-channel transistors 791–794 and 765–768. N-channel transistors 791–794 and inverters 751–754 form half-latches. Thus n-channel transistors 791–794 have their drains connected to a power-supply line and their emitters each connected to node B. N-channel transistors 761–764 are respectively connected to n-channel transistors 771–774 in series and n-channel transistors 765–768 are respectively connected to n-channel transistors 775–778 in series, the gates of n-channel transistors 771–774 and 775–778 respectively receiving complementary addresses /XA1 to /XA4 and XA1 to XA4.

The drains of n-channel transistors 761–764 and 765–768 are connected in common and thus to a node X. Node X is connected to an input of inverter 781 and the source of n-channel transistor 782 and the connection point is precharged by a p-channel transistor 780. N-channel transistor 782 and inverter 781 form a half-latch, inverter 781 having an output connected to the gate of n-channel transistor 782.

The destruction operation of FIG. 19 is similar to that of FIG. 18. In response to address signals A1 to A4, the address programming devices 741–744 gate oxide films are destroyed successively.

In the detection operation, signal /Pre turns on p-channel transistor 780 to precharge node X. Address signals A1 to A4 input all attain a high level and each node A attains the ground potential. When any of complementary addresses /XA1 to /XA4 and XA1 to XA4 is different from a programmed address, node X attains the ground potential and spare activation signal NE thus attains a high level so that a normal word line rises. By contrast, when the complementary signals are all programmed addresses, node X is maintained precharged and spare activation signal NE thus attains a low level.

Thus according to the embodiments of the present invention a transistor with a gate electrode formed on two types of gate oxide films different in thickness provided on a semiconductor substrate constitutes an address programming device which is inserted in a latch circuit or arranged in an array to provide a programming device which does not require laser-blowing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
    two types of gate oxide films formed on a semiconductor substrate and differing in thickness; and
    a gate electrode formed on said gate oxide films; wherein:
        said two types of gate oxide films overlap;
        said two types of gate oxide films different in thickness include an upper gate oxide film and a lower gate oxide film;
        said gate electrode includes an upper gate electrode formed on said upper gate oxide film and a lower gate electrode formed on said lower gate oxide film;
        a gate structure formed by said upper gate oxide film and upper gate electrode overlaps with a gate structure formed by said lower gate oxide film and lower gate electrode; and
        said semiconductor device forms a programming device including source/drain regions, further comprising four nodes connected to said upper gate electrode, said lower gate electrode, said source region and said drain region; wherein a node of said lower gate electrode is charged to a potential and a node of said source electrode is charged to a potential; and when a node of said drain region receives an address signal and a node of said upper gate electrode attains a high potential, determination is made that said lower gate oxide film is not destroyed for a low potential of said node of said source electrode and determination is made that said lower gate oxide film is destroyed and programmed for a high potential of said node of said source electrode.

2. A semiconductor device transistor for use in a memory programming device, comprising:

two types of gate oxide films of different thickness formed respectively as an upper gate oxide film and lower gate oxide film on a semiconductor substrate, the two oxide films overlapping; and an upper gate electrode formed on said upper gate oxide film and a lower gate electrode formed on said lower gate oxide film; wherein:

an upper gate structure formed by said upper gate oxide film and upper gate electrode overlaps a lower gate structure formed by said lower gate oxide film and lower gate electrode;

said lower gate structure forms a floating structure to provide for programming of the device by changing a threshold value of the transistor; and the programming device comprises a latch comprising a pair of said transistors in cross coupled configuration; and the cross coupled transistors have commonly connected source regions switchably connected between a first and second power supply terminal in accordance with switched operation of the device between a data read mode and a data write mode.

3. A semiconductor transistor for use in a memory programming device, comprising:

two types of gate oxide films of different thickness formed respectively as an upper gate oxide film and lower gate oxide film on a semiconductor substrate, the upper gate oxide film partially overlapping the lower gate oxide film; and a gate electrode formed on the overlapping portions of the upper and lower gate oxide films and on a non-overlapped portion of the lower gate oxide film; wherein:

the programming device comprises a latch circuit comprising a pair of said transistors in cross coupled connection, a source region of each transistor of the pair connected together and to a first power supply;

the latch circuit comprises a second pair of transistors connected to the first recited pair of transistors respectively at first and second nodes, voltage potential applied to each of the nodes being inverted in accordance with switched operation of the device between a data read mode and a data write mode; and a source electrode of the latch circuit switches between Vpp and Vcc via a switch in reading/writing.

* * * * *